(12) United States Patent
Liu et al.

(10) Patent No.: US 11,204,546 B2
(45) Date of Patent: Dec. 21, 2021

(54) MASKING PROCESS AND MASK SET (71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Zhiheng Liu, Beijing (CN); Hao Dong, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 225 days.

(21) Appl. No.: 16/394,103

(22) Filed: Apr. 25, 2019

(65) Prior Publication Data

US 2020/0073229 A1 Mar. 5, 2020

(30) Foreign Application Priority Data

Aug. 31, 2018 (CN) .......................... 201811014505.8

(51) Int. Cl.
*G03F 1/42* (2012.01)
*G03F 7/20* (2006.01)
*G02F 1/1362* (2006.01)
*G03F 9/00* (2006.01)
*H01L 27/12* (2006.01)

(52) U.S. Cl.
CPC .............. *G03F 1/42* (2013.01); *G02F 1/1362* (2013.01); *G03F 7/70433* (2013.01); *G03F 7/70633* (2013.01); *G03F 9/7003* (2013.01); *H01L 27/1218* (2013.01); *H01L 27/1288* (2013.01)

(58) Field of Classification Search
CPC .... G03F 1/42; G03F 7/70433; G03F 7/70633; G03F 9/00
USPC ........................................ 355/77; 430/5, 322
See application file for complete search history.

(56) References Cited

U.S. PATENT DOCUMENTS

| 4,914,829 A | 4/1990 | Keaton |
| 8,551,795 B2 | 10/2013 | Lee et al. |
| 10,837,111 B2 | 11/2020 | Vercesi et al. |
| (Continued) | | |

FOREIGN PATENT DOCUMENTS

| CN | 102560409 | 7/2012 |
| CN | 103713467 | 4/2014 |
| (Continued) | | |

OTHER PUBLICATIONS

Chinese Patent Office Action dated Mar. 4, 2021 corresponding to Chinese Patent Application No. 201811014505.8; 21 pages.

*Primary Examiner* — Hung Nguyen
(74) *Attorney, Agent, or Firm* — Leason Ellis LLP (57) ABSTRACT A masking process and a mask set. The masking process includes: aligning a first mask with a stage carrying a substrate to be patterned; forming a first layer structure and a first overlay correction pattern on the substrate to be patterned by using the first mask; correcting with an image sensor and the first overlay correction pattern; aligning a second mask with the stage; forming a second layer structure and a second overlay correction pattern on the substrate to be patterned by using the second mask; and correcting with the image sensor and the second overlay correction pattern.

11 Claims, 9 Drawing Sheets (56) References Cited

U.S. PATENT DOCUMENTS

| | | | | |
|---|---|---|---|---|
| 2012/0244459 A1* | 9/2012 | Chou | ............... | G03F 1/42 |
| | | | | 430/5 |
| 2013/0298088 A1* | 11/2013 | Lee | ............... | G03F 1/72 |
| | | | | 716/52 |
| 2014/0272718 A1* | 9/2014 | Yu | ............... | G03F 1/42 |
| | | | | 430/322 |

FOREIGN PATENT DOCUMENTS

| | | |
|---|---|---|
| CN | 106483770 | 3/2017 |
| CN | 107109621 | 8/2017 |
| JP | 08228122 | 9/1996 |
| JP | 09171106 | 6/1997 |

* cited by examiner

MASKING PROCESS AND MASK SET

The present application claims priority of the Chinese Patent Application No. 201811014505.8, filed on Aug. 31, 2018, the disclosure of which is incorporated herein by reference in its entirety as part of the present application.

TECHNICAL FIELD

Embodiments of the present disclosure relate to a masking process and a mask set.

BACKGROUND

With the continuous development of communication technology, 4G and 5G communication technologies have gradually become the mainstream of the market. Moreover, with the pursuit of light and thin mobile phones, the industry has paid more and more attention to the miniaturization and low cost of antennas.

Compared with traditional horn antenna, helical antenna and array antenna, a liquid crystal antenna has characteristics of miniaturization, broadband, multi-band and high gain, etc., and is an antenna which is more suitable for current development of the art. On the other hand, both the liquid crystal antenna and a thin film transistor liquid crystal display (TFT-LCD) include processes of film forming, exposure, etching, cell assemble, and liquid crystal filling. Therefore, the manufacturing process of the liquid crystal antenna is compatible with the manufacturing process of the thin film transistor liquid crystal display.

SUMMARY

At least one embodiment of the present disclosure provides a masking process, which includes: aligning a first mask with a stage carrying a substrate to be patterned; forming a first layer structure and a first overlay correction pattern on the substrate to be patterned by using the first mask; correcting with an image sensor and the first overlay correction pattern; aligning a second mask with the stage; forming a second layer structure and a second overlay correction pattern on the substrate to be patterned by using the second mask; and correcting with the image sensor and the second overlay correction pattern.

For example, in the masking process provided by an embodiment of the present disclosure, a thickness of the first layer structure is greater than 5 times of a thickness of the second layer structure.

For example, in the masking process provided by an embodiment of the present disclosure, the first mask includes a first mask pattern, a first alignment mark and a first overlay correction mark located at a periphery of the first mask pattern, the stage carrying the substrate to be patterned includes a second alignment mark, and aligning the first mask with the stage carrying the substrate to be patterned includes: using the first alignment mark and the second alignment mark to align the first mask with the stage carrying the substrate to be patterned.

For example, in the masking process provided by an embodiment of the present disclosure, forming the first layer structure and the first overlay correction pattern on the substrate to be patterned by using the first mask includes: performing a patterning process using the first mask to form the first layer structure corresponding to the first mask pattern and the first overlay correction pattern corresponding to the first overlay correction mark on the substrate to be patterned.

For example, in the masking process provided by an embodiment of the present disclosure, the second mask includes a second mask pattern, a third alignment mark and a second overlay correction mark located at a periphery of the second mask pattern, and aligning the second mask with the stage carrying the substrate to be patterned includes: using the third alignment mark and the second alignment mark to align the second mask with the stage carrying the substrate to be patterned.

For example, in the masking process provided by an embodiment of the present disclosure, forming the second layer structure and the second overlay correction pattern on the substrate to be patterned by using the second mask includes: performing a patterning process using the second mask to form the second layer structure corresponding to the second mask pattern and the second overlay correction pattern corresponding to the second overlay correction mark on the substrate to be patterned.

For example, in the masking process provided by an embodiment of the present disclosure, correcting with the image sensor and the first overlay correction pattern includes: acquiring an image of the first overlay correction pattern by using the image sensor; and adjusting parameters of an exposure machine according to distortion condition of the image of the first overlay correction pattern; correcting with the image sensor and the second overlay correction pattern includes: acquiring an image of the second overlay correction pattern by using the image sensor; and adjusting parameters of the exposure machine according to distortion condition of the image of the second overlay correction pattern.

For example, in the masking process provided by an embodiment of the present disclosure, the second mask further includes an automatic distortion control mark, and the masking process further includes: performing a patterning process using the second mask to form an automatic distortion control pattern corresponding to the automatic distortion control mark on the substrate to be patterned.

For example, the masking process provided by an embodiment of the present disclosure further includes: aligning a third mask with the substrate to be patterned, wherein the third mask includes a fourth alignment mark, and the third mask is aligned with the substrate to be patterned by using the fourth alignment mark and the automatic distortion control pattern.

For example, in the masking process provided by an embodiment of the present disclosure, the automatic distortion control pattern is formed simultaneously with the second layer structure and the second overlay correction pattern.

For example, in the masking process provided by an embodiment of the present disclosure, the automatic distortion control pattern is on a same layer as the second layer structure and the second overlay correction pattern.

At least one embodiment of the present disclosure also provides a mask set, which includes: a first mask including a first mask pattern, a first alignment mark and a first overlay correction mark located at a periphery of the first mask pattern; and a second mask including a second mask pattern, a third alignment mark and a second overlay correction mark located at a periphery of the second mask pattern, wherein the first mask pattern and the second mask pattern are configured to form a first layer structure and a second layer structure of a semiconductor device sequentially, the first alignment mark and the third alignment mark are configured to be respectively aligned with a second alignment mark on a stage carrying a substrate to be patterned, the first overlay correction mark and the second overlay correction mark are respectively configured to correct for overlay precision.

For example, in the mask set provided by an embodiment of the present disclosure, a thickness of the first layer structure is greater than 5 times of a thickness of the second layer structure.

For example, in the mask set provided by an embodiment of the present disclosure, the second mask further includes an automatic distortion control mark.

For example, in the mask set provided by an embodiment of the present disclosure, the first alignment mark includes two parallel first horizontal strip marks extending in a first direction and two parallel first vertical strip marks extending in a second direction, the second alignment mark includes a second horizontal strip mark extending in the first direction and a second vertical strip mark extending in the second direction, the first direction and the second direction are perpendicular to each other; the third alignment mark includes two parallel third horizontal strip marks extending in the first direction and two parallel third vertical strip marks extending in the second direction, a shape of the first overlay correction mark includes a rectangular frame, and a shape of the second overlay correction mark includes a rectangular frame.

For example, in the mask set provided by an embodiment of the present disclosure, upon both the first mask and the second mask being aligned with the stage, the third alignment mark and the second overlay correction mark are located at an outer side of the first alignment mark and the first overlay correction mark.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
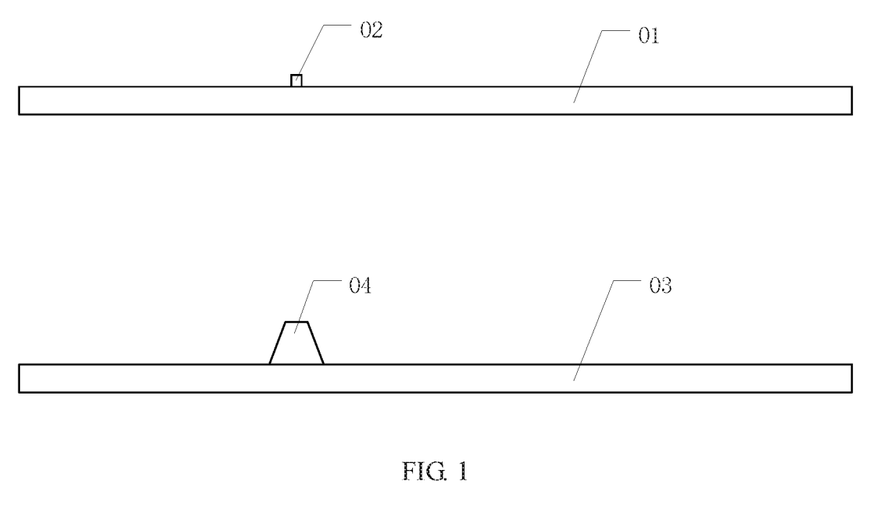
FIG. 1 is a schematic dimensional comparison diagram of a cross section of an ADC (Automatic Distortion Control) pattern on a substrate of a thin film transistor liquid crystal display and a cross section of an ADC pattern on a substrate of a liquid crystal antenna.

At present, the manufacturing process of a liquid crystal antenna is compatible with the manufacturing process of thin film transistor liquid crystal display. However, considering signal intensity and power consumption of liquid crystal antenna, in the manufacturing process of liquid crystal antenna, aluminum (Al), molybdenum (Mo) and other metal materials in the manufacturing process of thin film transistor liquid crystal display need to be replaced by copper (Cu), and a thickness of Cu film layer reaches micron order of magnitude. The thickness of a Cu film layer in the manufacturing process of liquid crystal antenna is greater than nearly ten times of a thickness of a metal film layer such as an Al film layer or a Mo film layer, etc., in the manufacturing process of thin film transistor liquid crystal display. At this point, the increase of the thickness of the film layer to be manufactured has a great influence on an etching process, and there will be a large critical dimension bias (CD Bias) after the etching process (for example, a wet etching process). FIG. 1 shows a schematic dimensional comparison diagram of a cross section of an ADC pattern on a substrate of a thin film transistor liquid crystal display and a cross section of an ADC pattern on a substrate of a liquid crystal antenna. As shown in FIG. 1, compared with that a metal film layer 02 having a thickness of about 3000 Å is formed on a substrate 01 of the thin film transistor liquid crystal display, a thickness of a metal film layer 04 on a substrate 03 of the liquid crystal antenna is relatively large (for example, 37000 Å), the key dimension bias caused by etching is unavoidable. A large CD bias results in a bold ADC pattern used for alignment in a masking process, namely a large linewidth of the ADC pattern (as shown in FIG. 1), which makes an exposure machine unable to determine an exact central position of the ADC pattern. The exposure machine cannot achieve automatic alignment, which requires engineers to do manual alignment, so it is difficult to meet the demand of mass production.

Figure 2A:
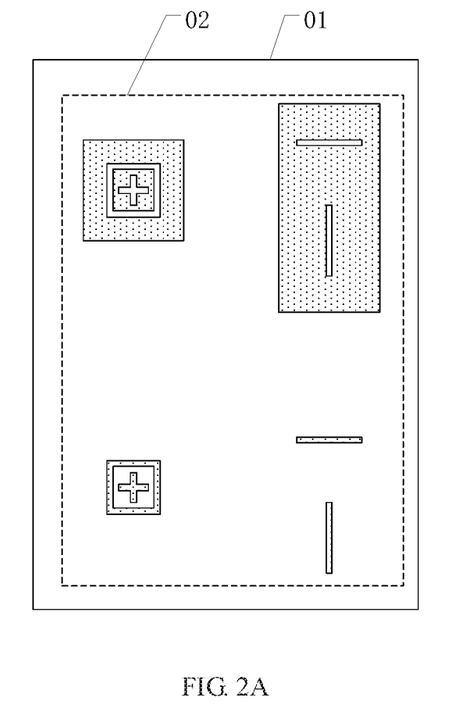
FIG. 2A is a schematic diagram of an ADC pattern on a substrate of a thin film transistor liquid crystal display.
Figure 2B:
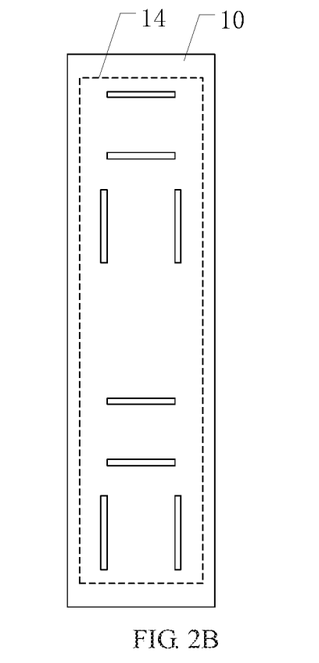
FIG. 2B is a schematic diagram of an ADC mark on a mask.
Figure 2C:
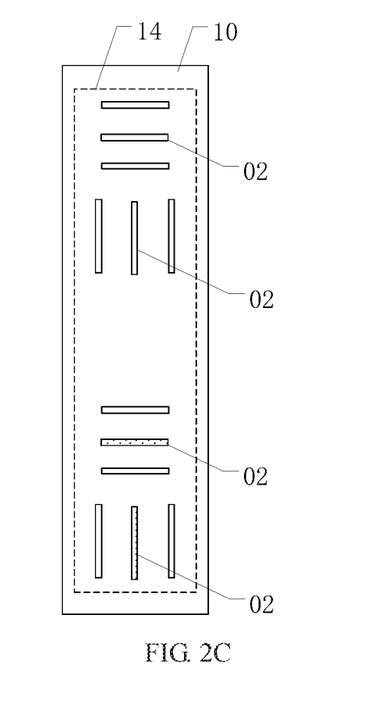
FIG. 2C is a schematic diagram of alignment of a thin film transistor liquid crystal display product.

FIG. 2A is a schematic diagram of an ADC pattern on a substrate of a thin film transistor liquid crystal display; FIG. 2B is a schematic diagram of an ADC mark on a mask; and FIG. 2C is a schematic diagram of alignment of a thin film transistor liquid crystal display product. In the manufacturing process of a usual thin film transistor liquid crystal display, after aligning a first mask with a stage carrying a substrate, the first mask is used to form a metal film layer having a thickness of about 3000 Å and an ADC pattern 02 shown in FIG. 2A on the substrate at the same time, and then an alignment process of a second mask is performed. In the alignment process of the second mask, as shown in FIG. 2C, an exposure machine (for example, a Canon exposure machine) moves "one horizontal section and one vertical section" of the ADC pattern 02 shown in FIG. 2A on the substrate to a center of "two horizontal sections and two vertical sections" of an ADC mark 14 shown in FIG. 2B on the second mask, thereby realizing an automatic alignment of the second mask. It should be noted that the two masks mentioned above (the first mask and the second mask) are masks used to form different film layers in the thin film transistor liquid crystal display; in addition, a pattern in the left half of the ADC pattern 02 shown in FIG. 2A is used to position the ADC pattern by an image sensor, that is, the exposure machine can find the ADC pattern by finding the pattern firstly, thereby facilitating that the exposure machine positions the ADC pattern quickly. A pattern in the right half of the ADC pattern 02 shown in FIG. 2A is used for alignment, for example, for aligning a mask with the substrate.

Figure 3A:
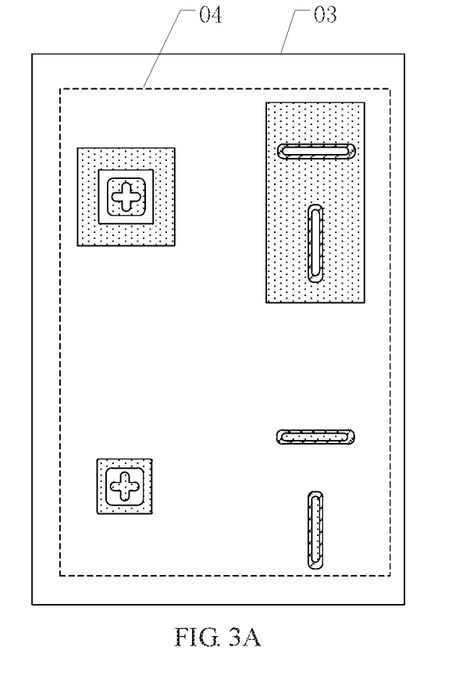
FIG. 3A is a schematic diagram of an ADC pattern on a substrate of a liquid crystal antenna.
Figure 3B:
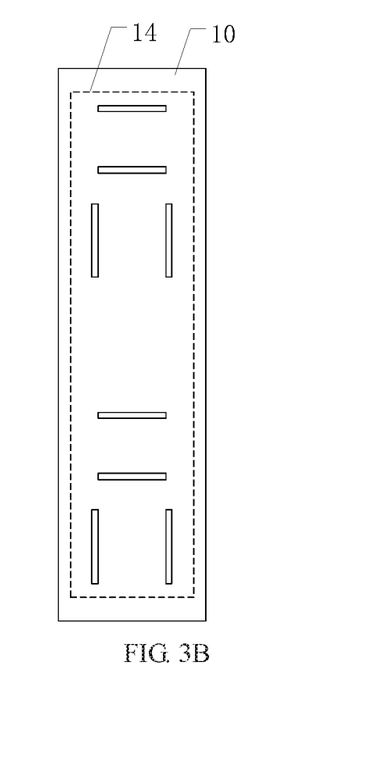
FIG. 3B is a schematic diagram of an ADC mark on a mask.
Figure 3C:
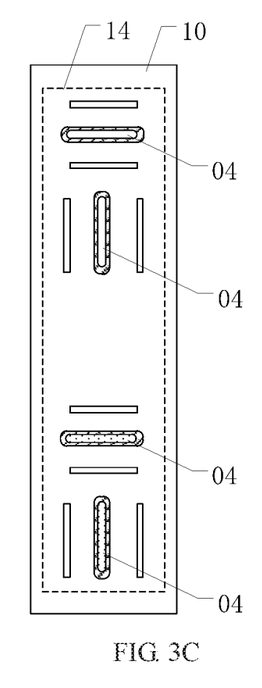
FIG. 3C is a schematic diagram of alignment of a liquid crystal antenna product.

FIG. 3A is a schematic diagram of an ADC pattern on a substrate of a liquid crystal antenna; FIG. 3B is a schematic diagram of an ADC mark on a mask; and FIG. 3C is a schematic diagram of alignment of a liquid crystal antenna product. Because the thickness of a metal film layer of a liquid crystal antenna product is large (for example, 37000 Å), as shown in FIG. 3A, "one horizontal section and one vertical section" of an ADC pattern 04 formed on a substrate is too bold, that is, the linewidth of the ADC pattern is large (as shown in FIG. 3A). After aligning a first mask with a stage carrying a substrate, the first mask is used to form a metal film layer having a thickness of about 37000 Å and an ADC pattern 04 shown in FIG. 3A on the substrate at the same time, and then an alignment process of a second mask is performed. However, in the alignment process of the second mask, as shown in FIG. 3C, the exposure machine can not recognize a center of the ADC pattern 04 shown in FIG. 3A, and cannot move the "one horizontal section and one vertical section" of the ADC pattern 04 shown in FIG. 3A on the substrate to a center of "two horizontal sections and two vertical sections" of an ADC mark 14 shown in FIG. 3B on another mask 10, resulting in a failure of automatic alignment.

Embodiments of the present disclosure provide a masking process and a mask set. The masking process includes: aligning a first mask with a stage carrying a substrate to be patterned; forming a first layer structure and a first overlay correction pattern on the substrate to be patterned by using the first mask; correcting with an image sensor and the first overlay correction pattern; aligning a second mask with the stage; forming a second layer structure and a second overlay correction pattern on the substrate to be patterned by using the second mask; and correcting with the image sensor and the second overlay correction pattern. The masking process directly aligns the second mask with the stage, rather than aligning the second mask with the substrate having the ADC pattern, which can avoid the failure of automatic alignment resulting from that the exposure machine is unable to recognize the exact central position of the ADC pattern; moreover, the masking process takes advantage of the image sensor to correct for the first mask and the second mask respectively through the first overlay correction pattern and the second overlay correction pattern, thereby ensuring alignment precision of the second mask. Therefore, the masking process can realize automatic alignment of a product having a thick film layer, such as a liquid crystal antenna, without reforming the production line equipment, thereby realizing the mass production of the products with the thick film layer, such as the liquid crystal antenna, and reducing cost; in addition, the masking process does not add additional process steps, thereby reducing an influence on production capacity.

The masking process and the mask set provided by embodiments of the present disclosure will be described in detail below with reference to the accompanying drawings.

Figure 4:
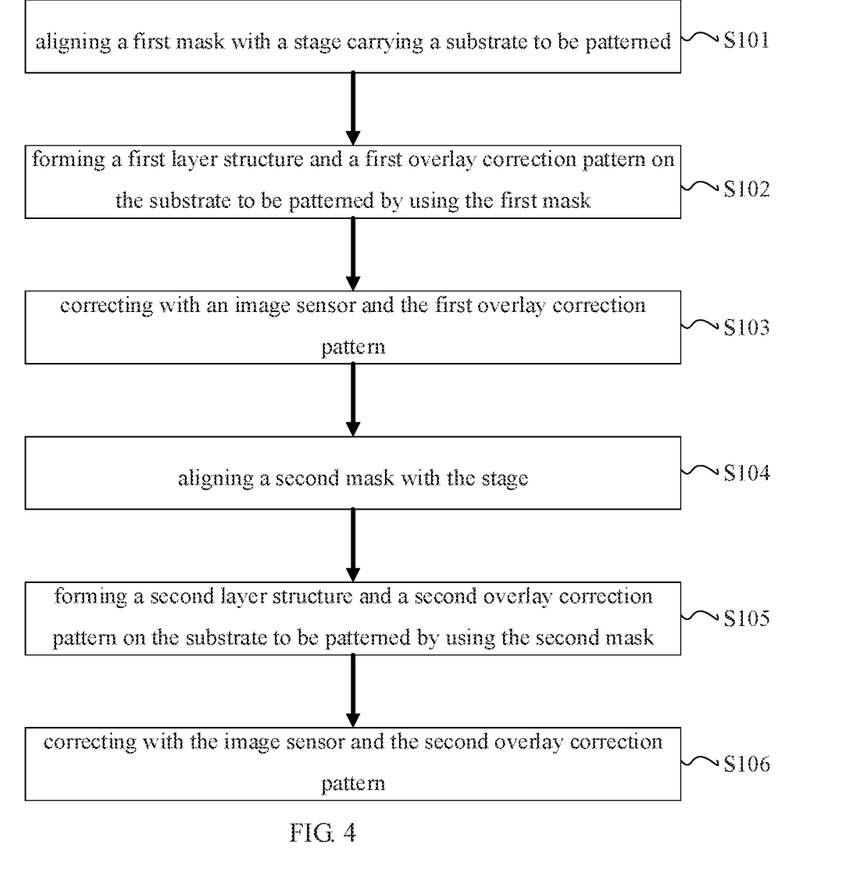
FIG. 4 is a flowchart of a masking process provided by an embodiment of the present disclosure.

FIG. 4 is a flowchart of a masking process provided by an embodiment of the present disclosure. As shown in FIG. 4, the masking process includes steps S101 to S106 as follows.

Step S101: aligning a first mask with a stage carrying a substrate to be patterned.

For example, the substrate to be patterned can include a base substrate and a metal layer disposed as an entire layer. The base substrate can include a glass substrate, a quartz substrate or a plastic substrate, and the metal layer can be a copper layer, which are not limited in the embodiments of the present disclosure. It should be noted that in order to facilitate optical alignment, the base substrate can be a transparent substrate.

For example, the first mask can be aligned with the stage carrying the substrate to be patterned by using a stage rotation control (SRC) mark on the stage carrying the substrate to be patterned and a SRC mark on the first mask.

Step S102: forming a first layer structure and a first overlay correction pattern on the substrate to be patterned by using the first mask.

For example, the first mask is used to form a corresponding photoresist pattern on the substrate to be patterned (including the base substrate and the metal layer disposed as an entire layer), and then the photoresist pattern is used as a mask to remove an excess part of the metal layer by an etching process, so that the metal layer is patterned to form the first layer structure and the first overlay correction pattern simultaneously.

Step S103: correcting with an image sensor and the first overlay correction pattern.

For example, the image sensor is used to acquire an image of the first overlay correction pattern formed on the substrate, and then parameters of the exposure machine are adjusted by comparing the image of the first overlay correction pattern with a standard first overlay correction pattern, thereby performing a correction to improve the overlay precision. It should be noted that, upon the parameters of the exposure machine being adjusted, the adjusted parameters can be stored to improve the overlay precision of subsequent products of a same batch. The current photoresist pattern can also be removed, and a new photoresist pattern can be formed by performing exposure and development again, thereby improving the overlay precision of the current product.

Step S104: aligning a second mask with the stage.

For example, the second mask can be aligned with the stage carrying the substrate to be patterned by using the stage rotation control (SRC) mark on the stage carrying the substrate to be patterned and a SRC mark on the second mask.

Step S105: forming a second layer structure and a second overlay correction pattern on the substrate to be patterned by using the second mask.

Step S106: correcting with the image sensor and the second overlay correction pattern.

For example, the image sensor is used to acquire an image of the second overlay correction pattern formed on the substrate, and then the parameters of the exposure machine are adjusted by comparing the image of the second overlay correction pattern with a standard second overlay correction pattern, thereby performing a correction to improve the overlay precision.

When a product having a thick film layer is manufactured by using the masking process provided by the present embodiment, firstly the first mask is aligned with the stage carrying the substrate to be patterned; the first mask is used to form the first overlay correction pattern and the first layer structure having a large thickness on the substrate to be patterned. Because the first layer structure has a large thickness, which has a great influence on an etching process, and can cause a large critical dimension bias (CD bias) after the etching process. The large CD bias results in a bold ADC pattern used for alignment in the masking process, namely a large linewidth of the ADC pattern, which makes an exposure machine unable to determine an exact central position of the ADC pattern. The exposure machine cannot achieve automatic alignment, which requires engineers to do manual alignment. The masking process provided by the present embodiment directly aligns the second mask with the stage, rather than aligning the second mask with the substrate having the ADC pattern, which can avoid the failure of automatic alignment resulting from that the exposure machine is unable to recognize the exact central position of the ADC pattern. In addition, the masking process takes advantage of the image sensor to correct for the first mask and the second mask respectively through the first overlay correction pattern and the second overlay correction pattern, thereby avoiding occurrence of defects. Therefore, the masking process can realize automatic alignment of a product having a thick film layer, such as a liquid crystal antenna, without reforming the production line equipment, thereby realizing the mass production of the products with the thick film layer, such as the liquid crystal antenna, and reducing cost; in addition, the masking process does not add additional process steps, thereby reducing an influence on production capacity.

Figure 5:
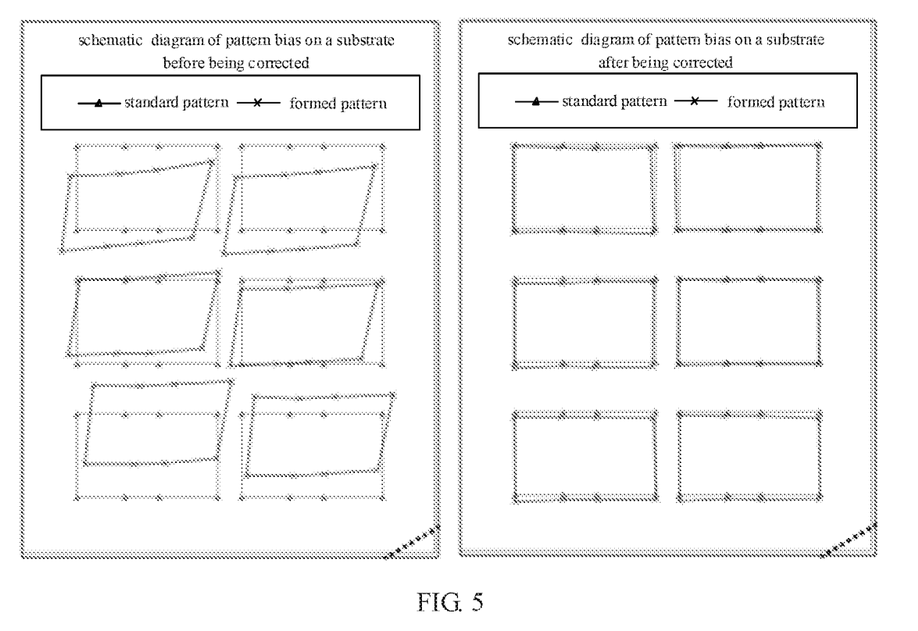
FIG. 5 is a schematic comparison diagram of a substrate formed according to a masking process provided by an embodiment of the present disclosure before being corrected and after being corrected.

FIG. 5 is a schematic comparison diagram of a substrate formed according to a masking process provided by an embodiment of the present disclosure before being corrected and after being corrected. As shown in FIG. 5, when not being corrected by using the image sensor through the first overlay pattern or the second overlay pattern, a formed pattern on the substrate has a great bias from a standard pattern; and when being corrected by using the image sensor through the first overlay pattern or the second overlay pattern, the formed pattern on the substrate has a little bias from the standard pattern, thereby avoiding occurrence of various defects. It should be noted that FIG. 5 shows a case where the bias is magnified by 20,000 times.

For example, in some examples, a thickness of the first layer structure is greater than 5 times of a thickness of the second layer structure.

For example, in some examples, the thickness of the first layer structure is greater than 10 times of the thickness of the second layer structure. For example, considering signal intensity and power consumption of the liquid crystal antenna, the thickness of a Cu film layer (e.g., 37000 Å) in the manufacturing process of liquid crystal antenna is greater than ten times of a thickness of a metal film layer (e.g., 3000 Å) such as an Al film layer or a Mo film layer, etc., in the manufacturing process of thin film transistor liquid crystal display. Therefore, the masking process is suitable for manufacturing a liquid crystal antenna product.

Figure 6:
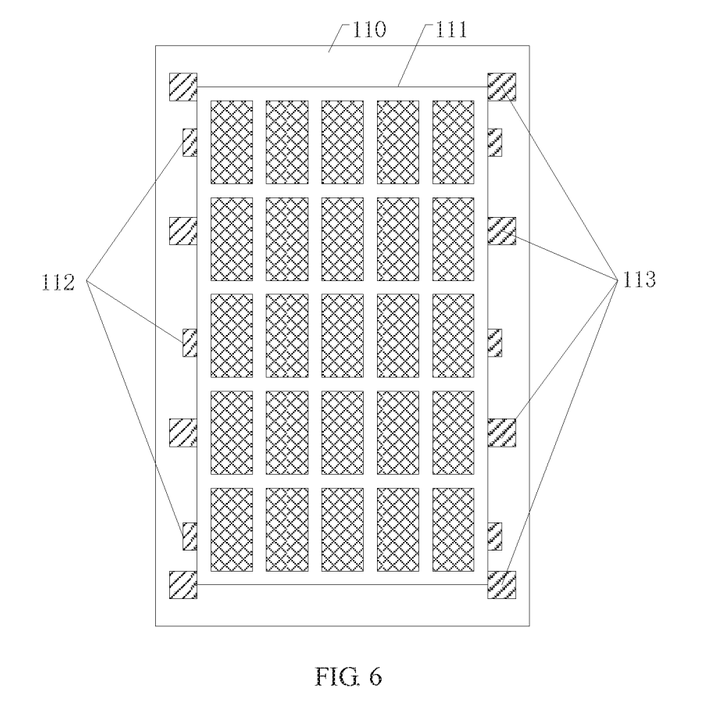
FIG. 6 is a schematic plan view of a first mask provided by an embodiment of the present disclosure.
Figure 7A:
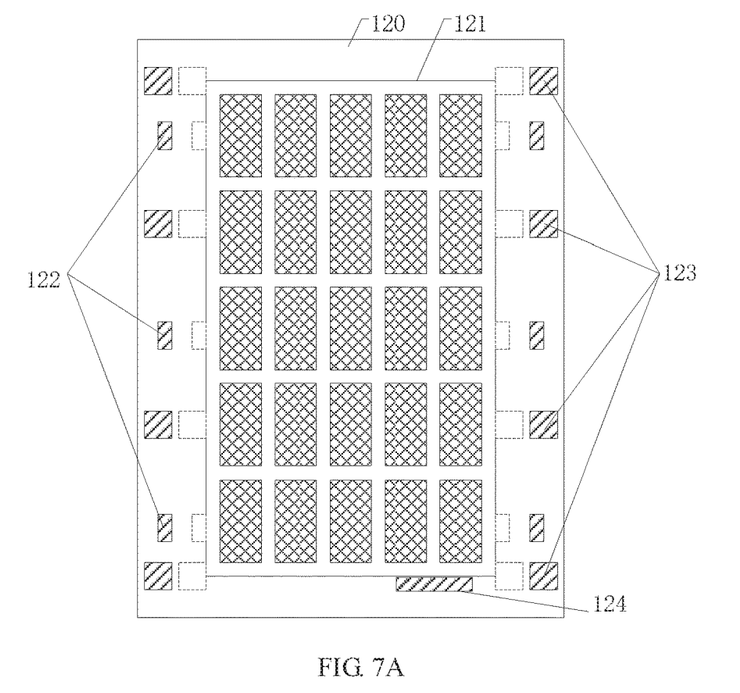
FIG. 7A is a schematic plan view of a second mask provided by an embodiment of the present disclosure.
Figure 7B:
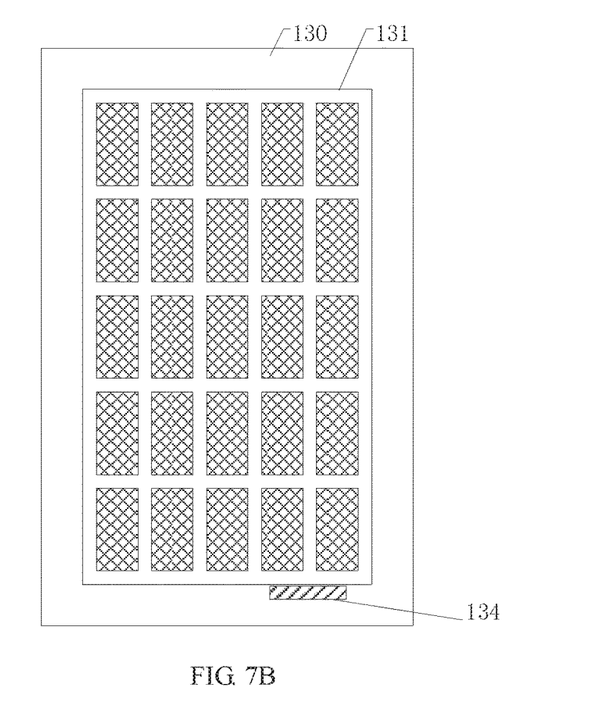
FIG. 7B is a schematic plan view of a third mask provided by an embodiment of the present disclosure.
Figure 8:
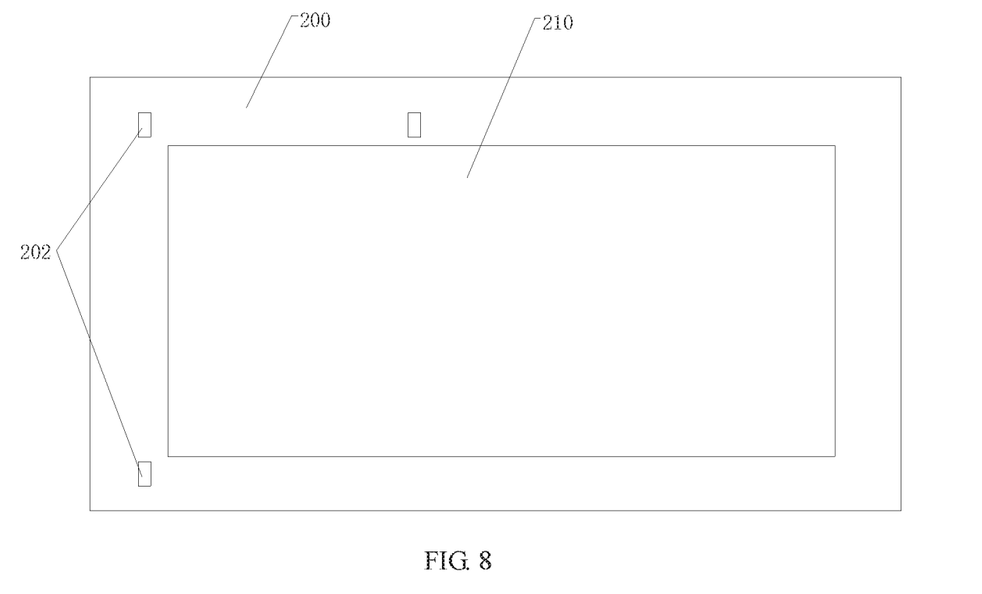
FIG. 8 is a schematic plan view of a stage carrying a substrate to be patterned provided by an embodiment of the present disclosure.

FIG. 6 is a schematic plan view of a first mask provided by an embodiment of the present disclosure. FIG. 7A is a schematic plan view of a second mask provided by an embodiment of the present disclosure, and FIG. 7B is a schematic plan view of a third mask provided by an embodiment of the present disclosure. FIG. 8 is a schematic plan view of a stage carrying a substrate to be patterned provided by an embodiment of the present disclosure.

For example, in some examples, as shown in FIG. 6 and FIG. 8, a first mask 110 includes a first mask pattern 111, a first alignment mark 112 and a first overlay correction mark 113 located at a periphery of the first mask pattern 111, the stage 200 carrying a substrate 210 to be patterned includes a second alignment mark 202, and the aligning the first mask with the stage carrying the substrate to be patterned described above includes: using the first alignment mark 112 and the second alignment mark 202 to align the first mask 110 with the stage 200 carrying the substrate 210 to be patterned. Because a position of the first alignment mark 112 on the first mask 110 is fixed, and a position of the second alignment mark 202 on the stage 200 is fixed, when the first alignment mark 112 is aligned with the second alignment mark 202, the first mask 110 is also aligned with the stage 200. It should be noted that a specific manner of using the first alignment mark and the second alignment mark to align the first mask with the stage carrying the substrate to be patterned can be a built-in manner of the exposure machine being used. For example, firstly, the first alignment mark and the second alignment mark can be aligned to compute and convert a coordinate system on the mask and a coordinate system on the stage, thereby acquiring coordinates of the pattern on the first mask relative to the coordinate system on the stage, and then the first mask is moved to a set position for steps such as exposure, development, etc.

For example, the first mask pattern 111 can be used to form the first layer structure described above, and the first layer structure can be the copper layer in the liquid crystal antenna. The first alignment mark 112 and the first overlay correction mark 113 are located at the periphery of the first mask pattern 111, so that an influence of the first alignment mark 112 and the first overlay correction mark 113 on the first layer structure can be avoided.

For example, in some examples, the forming the first layer structure and the first overlay correction pattern on the substrate to be patterned by using the first mask 110 described above includes: performing a patterning process using the first mask 110 to form the first layer structure corresponding to the first mask pattern 111 and the first overlay correction pattern corresponding to the first overlay correction mark 113 on the substrate to be patterned. An image of the first overlay correction pattern can be acquired by the image sensor, and then parameters of the exposure machine are adjusted by comparing the image of the first overlay correction pattern with a standard first overlay correction pattern, thereby performing a correction to improve the overlay precision. It should be noted that the patterning process described above can include steps such as exposure, development, etching, etc.

For example, a shape of the first mask pattern 111 can be designed according to a film layer actually needed to be formed, and a shape of the first overlay correction mark 113 can be a rectangular frame. Of course, the embodiments of the present disclosure include but are not limited thereto, and the first overlay correction mark can also be any other shape.

For example, in some examples, as shown in FIG. 7A, FIG. 7B and FIG. 8, a second mask 120 can include a second mask pattern 121, a third alignment mark 122 and a second overlay correction mark 123 located at a periphery of the first mask pattern 121, and the aligning the second mask with the stage carrying the substrate to be patterned described above includes: aligning the third alignment mark 122 with the second alignment mark 202 to align the second mask 120 with the stage 200 carrying the substrate to be patterned. Because a position of the third alignment mark 122 on the second mask 120 is fixed, and the position of the second alignment mark 202 on the stage 200 is fixed, when the third alignment mark 122 is aligned with the second alignment mark 202, the second mask 120 is also aligned with the stage 200; and the first mask 110 is aligned with the stage 200, so the second mask 120 is also aligned with the first mask 110. It should be noted that a specific manner of using the third alignment mark and the second alignment mark to align the second mask with the stage carrying the substrate to be patterned can be a built-in manner of the exposure machine being used. For example, firstly, the third alignment mark and the second alignment mark can be aligned to compute and convert a coordinate system on the mask and the coordinate system on the stage, thereby acquiring coordinates of the pattern on the second mask relative to the coordinate system on the stage, and then the second mask is moved to a set position for steps such as exposure, development, etc.

For example, in some examples, the forming the second layer structure and the second overlay correction pattern on the substrate to be patterned by using the second mask described above includes: performing a patterning process using the second mask 120 to form the second layer structure corresponding to the second mask pattern 121 and the second overlay correction pattern corresponding to the second overlay correction mark 123 on the substrate to be patterned. An image of the second overlay correction pattern can be acquired by the image sensor, and then parameters of the exposure machine are adjusted by comparing the image of the second overlay correction pattern with a standard second overlay correction pattern, thereby performing a correction to improve the overlay precision. It should be noted that the patterning process described above can include steps such as exposure, development, etching, etc.

For example, in some examples, correcting with the image sensor and the first overlay correction pattern includes: acquiring an image of the first overlay correction pattern by using the image sensor; and adjusting parameters of an exposure machine according to distortion condition of the image of the first overlay correction pattern. For example, the distortion condition of the image of the first overlay correction pattern can be acquired by comparing the image of the first overlay correction pattern and an image of the standard first overlay correction pattern.

For example, in some examples, correcting with the image sensor and the second overlay correction pattern includes: acquiring an image of the second overlay correction pattern by using the image sensor; and adjusting parameters of the exposure machine according to distortion condition of the image of the second overlay correction pattern. For example, the distortion condition of the image of the second overlay correction pattern can be acquired by comparing the image of the second overlay correction pattern and an image of the standard second overlay correction pattern.

For example, in some examples, as shown in FIG. 7A, the second mask 120 further includes an automatic distortion control mark 124, and the masking process further includes: performing a patterning process using the second mask 120 to form an automatic distortion control pattern corresponding to the automatic distortion control mark 124 on the substrate to be patterned. When a thickness of the second layer structure formed by the second mask is relatively small, the problem caused by too bold automatic distortion control pattern does not occur, so that a mask subsequently used can be automatically aligned with the second mask by using the formed automatic distortion control pattern. It should be noted that a specific shape of the automatic distortion control mark 124 can be referred to the automatic distortion control mark shown in FIG. 2A and FIG. 2B. For example, the automatic distortion control pattern is formed simultaneously with the second layer structure and the second overlay correction pattern. For example, the automatic distortion control pattern is on a same layer as the second layer structure and the second overlay correction pattern.

For example, in some examples, the masking process further includes: aligning a third mask with the substrate to be patterned. For example, after the alignment is performed, the third mask can be used to form a third layer structure on the substrate to be patterned. For example, as shown in FIG. 7B, a third mask 130 includes a third mask pattern 131 and a fourth alignment mark 134, and the third mask 130 is aligned with the substrate to be patterned by using the fourth alignment mark 134 and the formed automatic distortion control pattern described above.

An embodiment of the present disclosure also provides a mask set. The mask set includes a first mask and a second mask. As shown in FIG. 6, the first mask 110 includes a first mask pattern 111, a first alignment mark 112 and a first overlay correction mark 113 located at a periphery of the first mask pattern 111. As shown in FIG. 7A, the second mask 120 includes a second mask pattern 121, a third alignment mark 122 and a second overlay correction mark 123 located at a periphery of the second mask pattern 121. The first mask pattern 111 and the second mask pattern 121 are configured to form a first layer structure and a second layer structure of a semiconductor device sequentially, the first alignment mark 112 and the third alignment mark 122 are configured to be respectively aligned with a second alignment mark on a stage carrying a substrate to be patterned, the first overlay correction mark 113 and the second overlay correction mark 123 are respectively configured to correct for overlay precision.

For example, as shown in FIG. 8, the stage 200 includes a second alignment mark 202. Because a position of the first alignment mark 112 on the first mask 110 is fixed, and a position of the second alignment mark 202 on the stage 200 is fixed, when the first alignment mark 112 is aligned with the second alignment mark 202, the first mask 110 is also aligned with the stage 200. Because a position of the third alignment mark 122 on the second mask 120 is fixed, when the third alignment mark 122 is aligned with the second alignment mark 202, the second mask 120 is also aligned with the stage 200; and the first mask 110 is aligned with the stage 200, so the second mask 120 is also aligned with the first mask 110.

When a product having a thick film layer is manufactured by using the mask set provided by the present embodiment, firstly the first mask 110 is aligned with the stage 200 carrying the substrate to be patterned by using the first alignment mark 112 and the second alignment mark 202; then the first mask pattern 111 and the first overlay correction pattern 113 are used to form the first overlay correction pattern and the first layer structure having a large thickness on the substrate to be patterned, and then the second mask 120 is aligned with the stage 200 by using the third alignment mark 122 and the second alignment mark 202 directly, which can avoid the failure of automatic alignment resulting from that the exposure machine is unable to recognize the exact central position of the ADC pattern. In addition, the image sensor can be used to correct for overlay precision of the first mask 110 and the second mask 120 using the first overlay correction pattern formed by the first overlay correction mark 113 and the second overlay correction pattern formed by the second overlay correction mark 123, thereby avoiding occurrence of defects. Therefore, the mask set can realize automatic alignment of a product having a thick film layer, such as a liquid crystal antenna, without reforming the production line equipment, thereby realizing the mass production of the products with the thick film layer, such as the liquid crystal antenna, and reducing cost.

For example, as shown in FIG. 6, the first mask includes six first alignment marks 112 symmetrically distributed on both sides of the first mask pattern 111. Of course, the embodiments of the present disclosure include but are not limited thereto, and the number and location of the first alignment mark 112 can be set according to actual conditions.

For example, as shown in FIG. 6, the first mask includes eight first overlay correction marks 113 symmetrically distributed on both sides of the first mask pattern 111. Of course, the embodiments of the present disclosure include but are not limited thereto, and the number and location of the first overlay correction mark 113 can be set according to actual conditions.

For example, as shown in FIG. 7A, the first mask 110 and the second mask 120 are to be aligned with the stage 200, respectively, so a location of the third alignment mark 122 on the second mask 120 is set to be more outward than a location of the first alignment 112, that is, a distance between the third alignment mark 122 and the second mask pattern 121 is larger than a distance between the first alignment mark 112 and the first mask pattern 111. A dashed frame in FIG. 7A shows locations of the first alignment mark 112 and the first overlay correction mark 113 in FIG. 6. The third alignment mark 122 and the second overlay correction mark 123 do not overlap with the above-mentioned dashed frame, thereby avoiding an overlapping of the first overlay correction pattern and the second overlay correction pattern. For example, in a case where the first mask 110 and the second mask 120 are both aligned with the stage, the third alignment mark 122 and the second overlay correction mark 123 are located at an outer side of the first alignment mark 112 and the first overlay correction mark 113.

For example, in some examples, as shown in FIG. 7A, the second mask 120 further includes an automatic distortion control mark 124. Therefore, an automatic distortion control pattern corresponding to the automatic distortion control mark 124 can be formed on the substrate to be patterned by using the second mask 120. When a thickness of the second layer structure formed by the second mask is relatively small, the problem caused by the too bold automatic distortion control pattern does not occur, so that a mask subsequently used can be automatically aligned with the second mask by using the formed automatic distortion control pattern.

Figure 9:
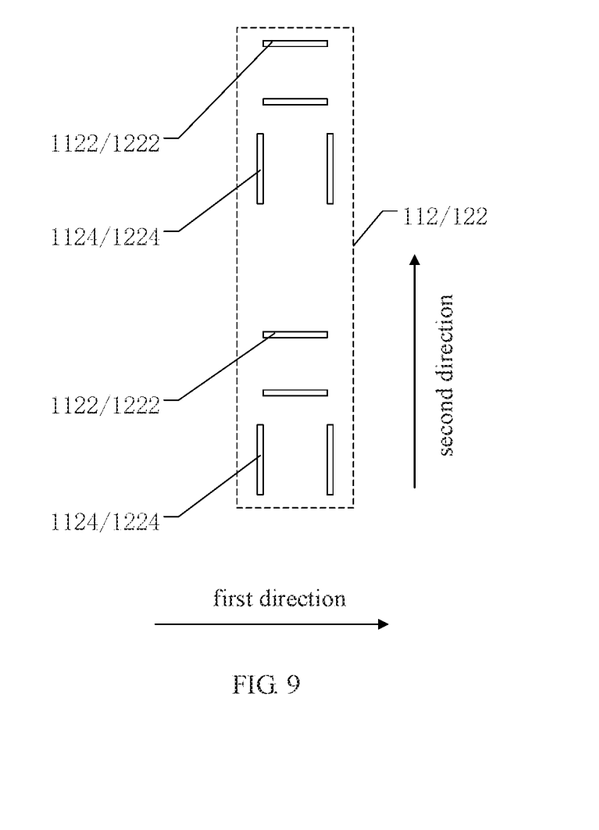
FIG. 9 is a schematic diagram of a pattern of a first alignment mark and a third alignment mark provided by an embodiment of the present disclosure.
Figure 10:
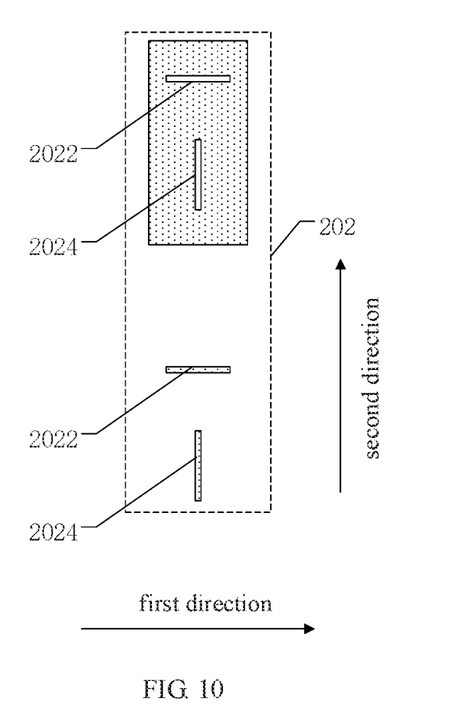
FIG. 10 is a schematic diagram of a pattern of a second alignment mark provided by an embodiment of the present disclosure.

FIG. 9 is a schematic diagram of a pattern of a first alignment mark and a third alignment mark provided by an embodiment of the present disclosure. FIG. 10 is a schematic diagram of a pattern of a second alignment mark provided by an embodiment of the present disclosure.

For example, in some examples, as shown in FIG. 9 and FIG. 10, the first alignment mark 112 includes two parallel first horizontal strip marks 1122 extending in a first direction and two parallel first vertical strip marks 1124 extending in a second direction, the second alignment mark 202 includes a second horizontal strip mark 2022 extending in the first direction and a second vertical strip mark 2024 extending in the second direction, and the first direction and the second direction are perpendicular to each other. By moving "one horizontal section and one vertical section" of the second alignment mark 202, namely the second horizontal strip mark 2022 extending in the first direction and the second vertical strip mark 2024 extending in the second direction, to a center of "two horizontal sections and two vertical sections" of the first alignment mark 112, namely to the center of the two parallel first horizontal strip marks 1122 extending in the first direction and the two parallel first vertical strip marks 1124 extending in the second direction, an automatic alignment is achieved. It should be noted that FIG. 10 shows two sets of second alignment marks 202, indicating a concave second alignment mark formed in a film layer and a convex second alignment mark formed by using the film layer on a surface of the stage. Therefore, correspondingly, FIG. 9 shows two sets of first alignment marks 112 or two sets of third alignment marks 122. In addition, the two sets of first alignment marks, or the two sets of second alignment marks, or the two sets of third alignment marks shown in FIG. 9 and FIG. 9, constitute the stage rotation control (SRC) mark described above.

For example, in some examples, as shown in FIG. 9 and FIG. 10, the third alignment mark 122 includes two parallel third horizontal strip marks 1222 extending in a first direction and two parallel third vertical strip marks 1224 extending in a second direction, and the first direction and the second direction are perpendicular to each other. By moving "one horizontal section and one vertical section" of the second alignment mark 202, namely the second horizontal strip mark 2022 extending in the first direction and the second vertical strip mark 2024 extending in the second direction, to a center of "two horizontal sections and two vertical sections" of the third alignment mark 122, namely to the center of the two parallel first horizontal strip marks 1222 extending in the first direction and the two parallel first vertical strip marks 1224 extending in the second direction, an automatic alignment is achieved.

Figure 11:
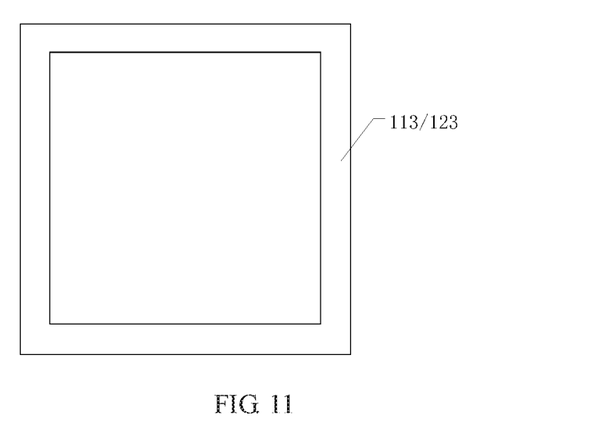
FIG. 11 is a schematic diagram of a first overlay correction mark and a second overlay correction mark provided by an embodiment of the present disclosure.

FIG. 11 is a schematic diagram of a first overlay correction mark and a second overlay correction mark provided by an embodiment of the present disclosure. As shown in FIG.

11, a shape of the first overlay correction mark 113 includes a rectangular frame, and a shape of the second overlay correction mark 123 includes a rectangular frame.

For example, in some examples, a thickness of the first layer structure is greater than 5 times of a thickness of the second layer structure.

For example, in some examples, the thickness of the first layer structure is greater than 10 times of the thickness of the second layer structure. For example, considering signal intensity and power consumption of the liquid crystal antenna, the thickness of a Cu film layer (e.g., 37000 Å) in the manufacturing process of liquid crystal antenna is greater than ten times of a thickness of a metal film layer (e.g., 3000 Å) such as an Al film layer or a Mo film layer, etc., in the manufacturing process of thin film transistor liquid crystal display.

The masking process provided by the embodiments of the present disclosure directly aligns the second mask with the stage, which can avoid the failure of automatic alignment resulting from that the exposure machine is unable to recognize the exact central position of the automatic distortion control (ADC) pattern; moreover, the masking process takes advantage of the image sensor to correct for the first mask and the second mask respectively through the first overlay correction pattern and the second overlay correction pattern, thereby ensuring alignment precision of the second mask. Therefore, the masking process can solve the problem that the existing production line equipment cannot achieve automatic alignment of a product having a thick film layer, such as a liquid crystal antenna and can realize automatic alignment of the product having a thick film layer, such as the liquid crystal antenna, without reforming the production line equipment, thereby realizing the mass production of the products with the thick film layer, such as the liquid crystal antenna, and reducing cost; in addition, the masking process does not add additional process steps, thereby reducing an influence on production capacity.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A masking process, comprising:
aligning a first mask with a stage carrying a substrate to be patterned;
forming a first layer structure and a first overlay correction pattern on the substrate to be patterned by using the first mask;
correcting with an image sensor and the first overlay correction pattern; aligning a second mask with the stage;
forming a second layer structure and a second overlay correction pattern on the substrate to be patterned by using the second mask; and
correcting with the image sensor and the second overlay correction pattern.

2. The masking process according to claim 1, wherein a thickness of the first layer structure is greater than 5 times of a thickness of the second layer structure.

3. The masking process according to claim 1, wherein the first mask comprises a first mask pattern, a first alignment mark and a first overlay correction mark located at a periphery of the first mask pattern, the stage carrying the substrate to be patterned comprises a second alignment mark, and aligning the first mask with the stage carrying the substrate to be patterned comprises:
using the first alignment mark and the second alignment mark to align the first mask with the stage carrying the substrate to be patterned.

4. The masking process according to claim 3, wherein forming the first layer structure and the first overlay correction pattern on the substrate to be patterned by using the first mask comprises:
performing a patterning process using the first mask to form the first layer structure corresponding to the first mask pattern and the first overlay correction pattern corresponding to the first overlay correction mark on the substrate to be patterned.

5. The masking process according to claim 1, wherein the second mask comprises a second mask pattern, a third alignment mark and a second overlay correction mark located at a periphery of the second mask pattern, and aligning the second mask with the stage carrying the substrate to be patterned comprises:
using the third alignment mark and the second alignment mark to align the second mask with the stage carrying the substrate to be patterned.

6. The masking process according to claim 5, wherein forming the second layer structure and the second overlay correction pattern on the substrate to be patterned by using the second mask comprises:
performing a patterning process using the second mask to form the second layer structure corresponding to the second mask pattern and the second overlay correction pattern corresponding to the second overlay correction mark on the substrate to be patterned.

7. The masking process according to claim 1, wherein
correcting with the image sensor and the first overlay correction pattern comprises: acquiring an image of the first overlay correction pattern by using the image sensor; and adjusting parameters of an exposure machine according to distortion condition of the image of the first overlay correction pattern,
correcting with the image sensor and the second overlay correction pattern comprises: acquiring an image of the second overlay correction pattern by using the image sensor; and adjusting parameters of the exposure machine according to distortion condition of the image of the second overlay correction pattern.

8. The masking process according to claim 1, wherein the second mask further comprises an automatic distortion control mark, and the masking process further comprises:
performing a patterning process using the second mask to form an automatic distortion control pattern corresponding to the automatic distortion control mark on the substrate to be patterned.

9. The masking process according to claim 8, further comprising:
aligning a third mask with the substrate to be patterned, wherein the third mask comprises a fourth alignment mark, and the third mask is aligned with the substrate to be patterned by using the fourth alignment mark and the automatic distortion control pattern.

10. The masking process according to claim 8, wherein the automatic distortion control pattern is formed simultaneously with the second layer structure and the second overlay correction pattern.

11. The masking process according to claim 8, wherein the automatic distortion control pattern is on a same layer as the second layer structure and the second overlay correction pattern.

* * * * *